(12) United States Patent
Barsun et al.

(10) Patent No.: US 6,842,345 B2
(45) Date of Patent: Jan. 11, 2005

(54) CIRCUIT BOARD SUPPORT ASSEMBLY

(75) Inventors: Stephan K. Barsun, Auburn, CA (US); Steven R. Hahn, El Dorado Hills, CA (US); Thomas J. Augustin, El Dorado Hills, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/230,771

(22) Filed: Aug. 29, 2002

(65) Prior Publication Data

US 2004/0042182 A1 Mar. 4, 2004

(51) Int. Cl.[7] .............................. H05K 1/14; H05K 5/00; H05K 5/04; H05K 5/06
(52) U.S. Cl. ....................... 361/758; 361/742; 361/804; 361/732; 361/740; 361/747; 361/759
(58) Field of Search ................................. 361/726, 728, 361/731, 732, 735, 740–742, 747, 756, 759, 785, 790, 801, 802, 807, 768, 769, 820, 825, 683–686, 737, 736, 758, 770, 804

(56) References Cited

U.S. PATENT DOCUMENTS

| | | | |
|---|---|---|---|
| 3,662,224 A | * 5/1972 | Rauch | ......................... 361/741 |
| 4,631,639 A | 12/1986 | Biraud | |
| 4,703,567 A | 11/1987 | Moore et al. | |
| 4,951,176 A | 8/1990 | Bergfried et al. | |
| 4,953,061 A | 8/1990 | Nitkiewicz | |
| 5,045,976 A | 9/1991 | Guilleminot | |
| 5,144,535 A | 9/1992 | Megens et al. | |
| 5,179,506 A | 1/1993 | Corbett et al. | |
| 5,221,811 A | 6/1993 | Seldin | |
| 5,274,193 A | 12/1993 | Bailey et al. | |
| 5,365,408 A | 11/1994 | Apitz | |
| 5,373,104 A | * 12/1994 | Brauer | ....................... 174/52.1 |
| 5,477,420 A | 12/1995 | Brooks | |
| 5,535,100 A | * 7/1996 | Lubahn et al. | ............... 361/801 |
| 5,757,618 A | * 5/1998 | Lee | ............... 361/686 |
| 5,793,618 A | * 8/1998 | Chan et al. | .................. 361/809 |
| 5,940,279 A | 8/1999 | Gademann et al. | |
| 6,075,208 A | 6/2000 | Persson | |
| 6,215,667 B1 | 4/2001 | Ady et al. | |
| 6,233,152 B1 | 5/2001 | Abbott et al. | |
| 6,305,966 B1 | 10/2001 | Arbogast et al. | |
| 6,317,330 B1 | * 11/2001 | Portman et al. | ............. 361/742 |
| 6,362,977 B1 | * 3/2002 | Tucker et al. | ............... 361/818 |
| 6,362,978 B1 | 3/2002 | Boe | |
| 6,424,537 B1 | 7/2002 | Paquin et al. | |
| 6,424,538 B1 | 7/2002 | Paquin | |
| 6,428,352 B1 | 8/2002 | Boyden | |
| 6,614,659 B2 | * 9/2003 | Feigenbaum et al. | ........ 361/719 |

OTHER PUBLICATIONS

PEM Bulletin CL 602, Self–Clinching Nuts, PEM Fastening Systems, 2000, 12 pages.
PEM Bulletin SK102, Keyhole Self–Clinching Standoffs, PEM Fastening Systems, 1997, 4 pages.
PEM Bulletin CH 1200, Concealed–Head Self–Clinching Studs & Standoffs, PennEngineering, 1997, 6 pages.
PEM Bulletin SO701, Self–Clinching Standoffs, PEM Fastening Systems, 1997, 12 pages.
PEM Bulletin K602, Fasteners for Use in or with PC Boards, PEM Fastening Systems, 1997, 12 pages.

* cited by examiner

Primary Examiner—Phuong T. Vu

(57) ABSTRACT

A circuit board support assembly includes a frame, an electronic component and a circuit board. The circuit board and the electronic component are each coupled to the frame along a common axis.

82 Claims, 6 Drawing Sheets

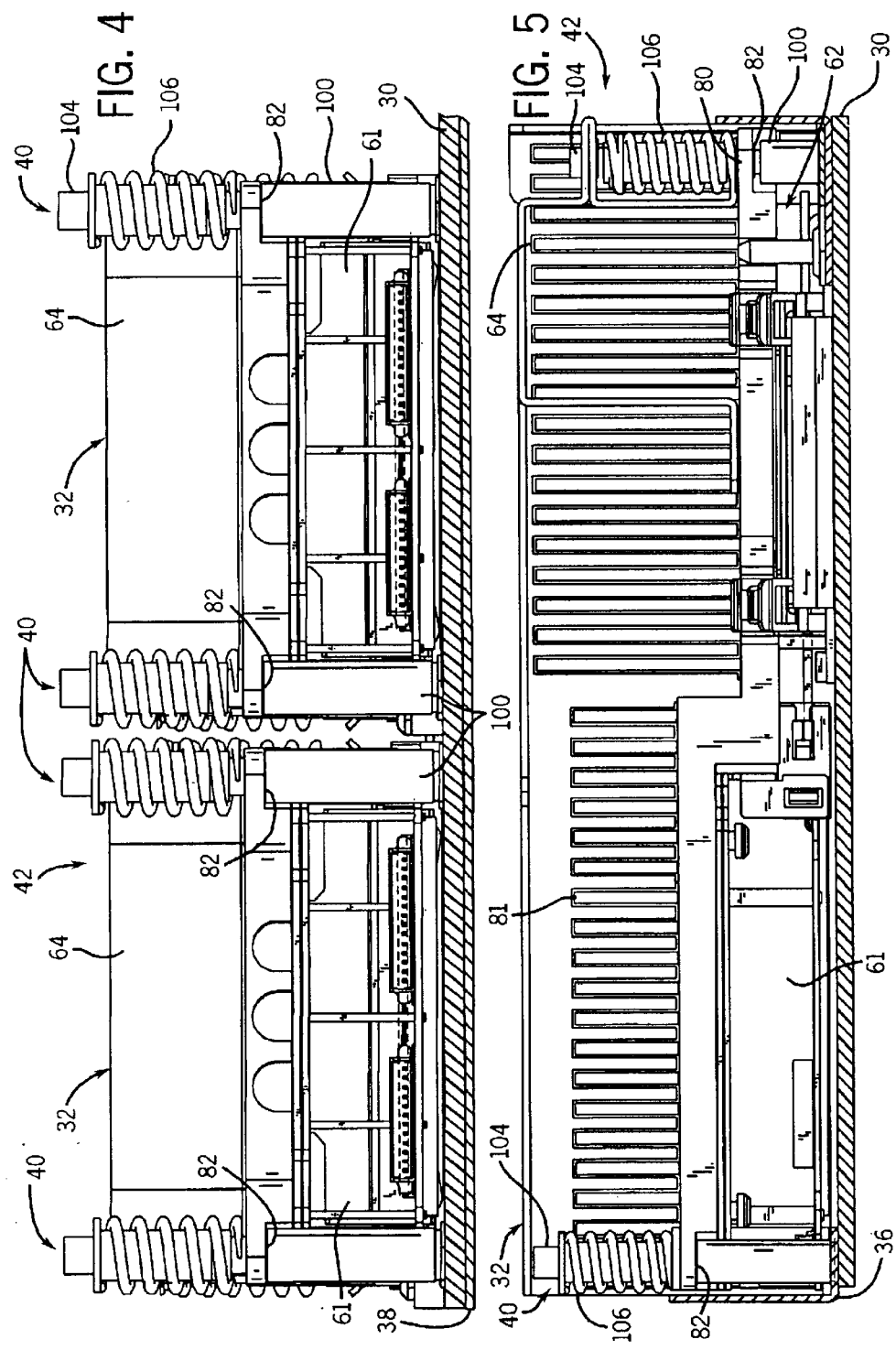

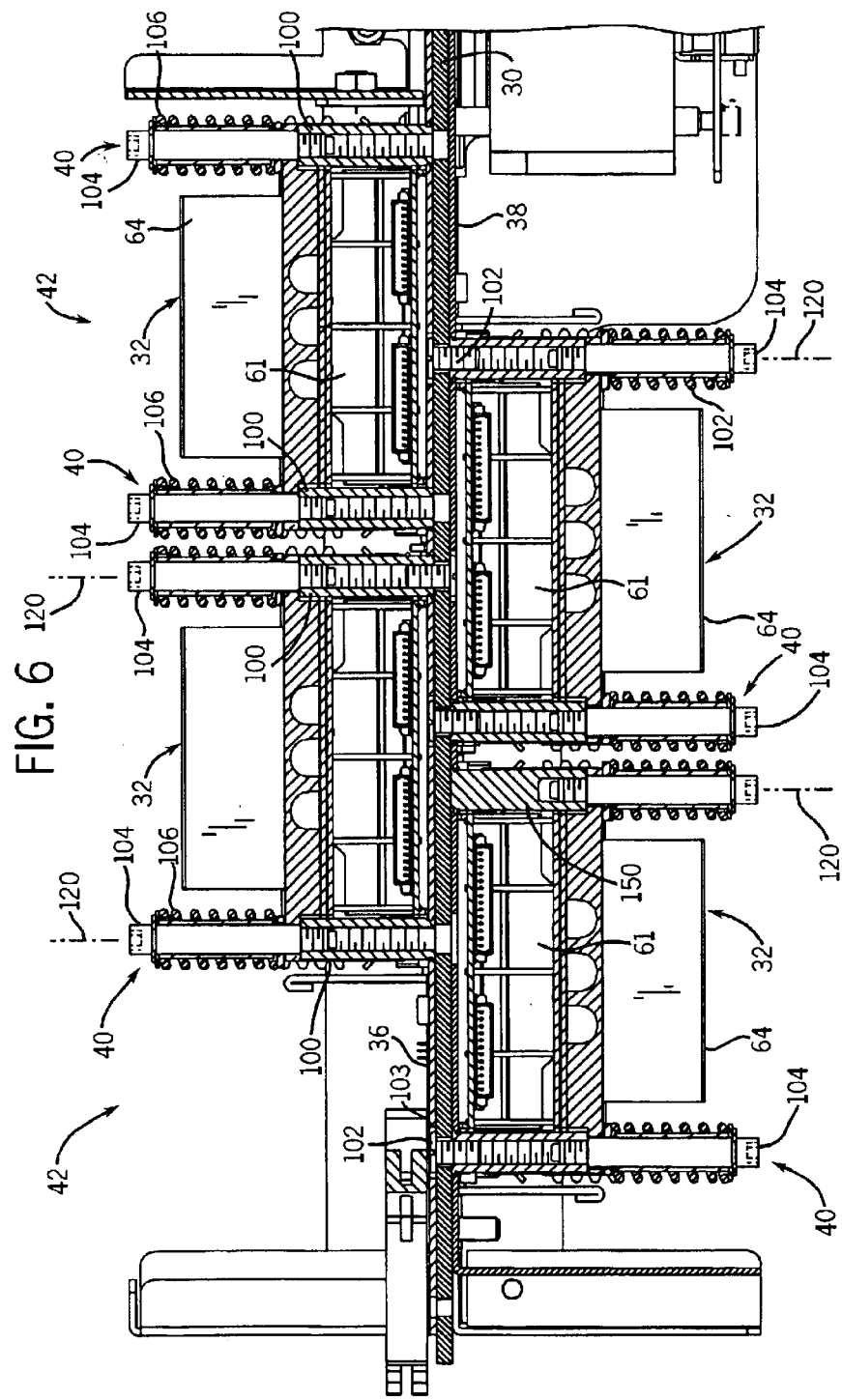

CIRCUIT BOARD SUPPORT ASSEMBLY

CROSS-REFERENCE TO RELATED PATENT APPLICATIONS

The present application is related to co-pending U.S. patent application Ser. No. 10/230,807 having the same title, inventors and filing date as the present application. The full disclosure of the above-identified co-pending related application is hereby incorporated by reference.

BACKGROUND OF THE INVENTION

Computing devices, such as servers, typically include at least one circuit board support assembly including a frame, a circuit board and a plurality of computing components such as processors. The frame, which serves as a rigidifying support structure for the circuit board, is generally made either by a casting process or by forming sheet metal. The circuit board is fastened to the frame by screws extending through the circuit board and into the frame.

Computing components, which frequently include heat sinks, are mounted relative to the circuit board using one of a variety of known methods. According to a first known method, standoffs having internally threaded bores are pressed into the circuit board itself. Electronic components are then fastened to the standoffs by screws extending through the components into the internally threaded bores of the standoffs. The components are further electrically connected to the circuit board by various pin and socket arrangements.

With cast frames, components are mounted relative to the circuit board using an alternative known method. Cast frames are typically formed from a softer metal such as magnesium or aluminum. As a result, an insert from a harder metal is often threaded, cast, or pressed into the cast frame. The insert includes an internally threaded bore. Electronic components are then fastened to the inserts by screws extending through the components into the internally threaded bores of the inserts. The components are further electrically connected to the circuit board by various pin and socket arrangements.

SUMMARY OF THE INVENTION

A circuit board support assembly is disclosed. The assembly includes a frame, a circuit board, an electronic component and at least one standoff. The at least one standoff is non-rotatably attached to the frame. The at least one standoff supports the electronic component relative to the circuit board.

According to another aspect of the present invention, a circuit board support assembly includes a support structure, a plurality of computing components and an interface permitting communication between the plurality of computing components. The assembly further includes retainer means non-rotatably attached to the support structure for retaining at least one of the plurality of computing components relative to the interface.

According to another aspect of the present invention, a method for assembling a circuit board support assembly includes the steps of securing a circuit board to a frame, non-rotatably coupling at least one standoff to the frame and mounting an electronic component against the at least one standoff relative to the circuit board.

BRIEF DESCRIPTION OF THE DRAWINGS

FIG. 4 is a sectional view of a portion of the circuit board support assembly of FIG. 2 taken along line 4—4.

FIG. 5 is a sectional view of a portion of the circuit board support assembly of FIG. 2 taken along line 5—5.

FIG. 6 is a fragmentary sectional view of the circuit board support assembly of FIG. 2 taken along line 6—6.

DETAILED DESCRIPTION OF THE PREFERRED EMBODIMENTS

Figure 1:
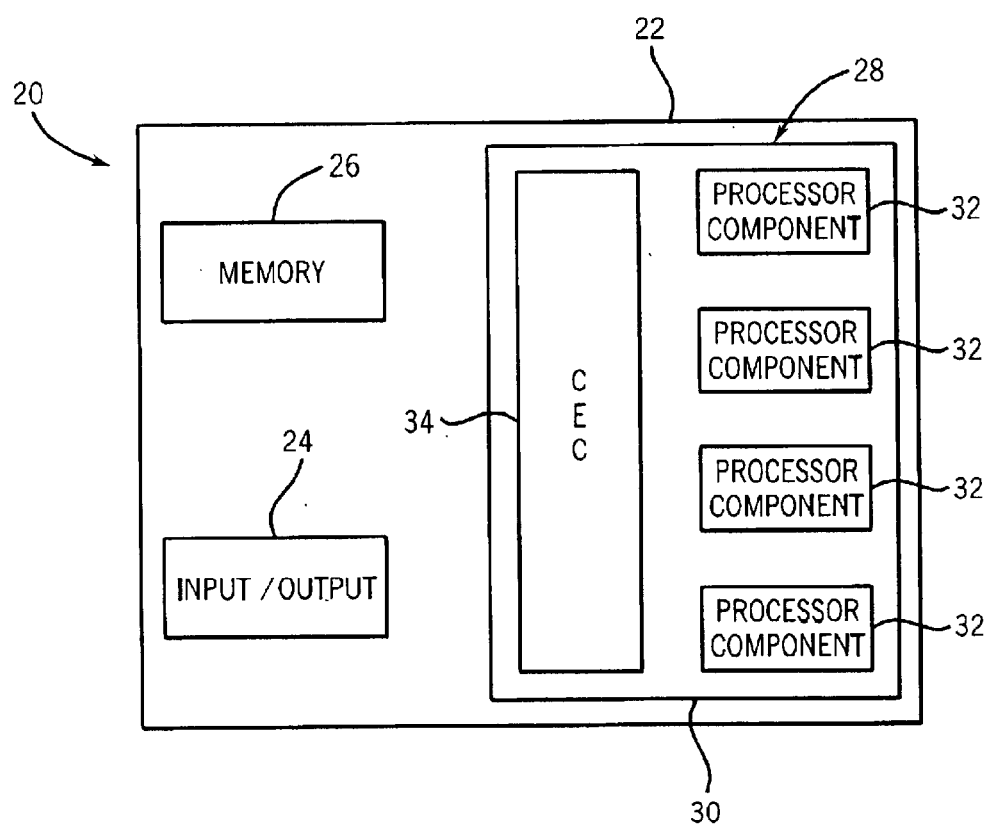
FIG. 1 is a schematic drawing of a computer device having a processor unit including one embodiment of circuit board support assembly of the present invention.

FIG. 1 schematically illustrates a computing device 20, an example of which is a server. Computing device 20 generally includes base board 22, input/output 24, memory 26 and processor 28. Base board 22 connects input/output 24, memory 26 and processor 28 and serves as an electronic highway between such units. Input/output 24 generally comprises an input/output board coupled to base board 22. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. The input/output board generally supports a plurality of input/output cards. Input/output 24 facilitates the use of additional peripherals such as tape drives, DVDs and the like with computing device 20.

Memory 26 is coupled to base board 22 and provides additional memory storage for computing device 20. In the particular embodiment shown, memory 26 comprises two memory extenders comprising boards carrying a plurality of memory cards.

Processor 28 does much of the computing or calculations for computing device 20 and generally includes a processor board or circuit board 30, a plurality of processor components 32 and a control 34 (known as a computer electronic control or CEC). Circuit board 30 generally comprises a conventionally known or future developed circuit board (also known as a printed circuit assembly) capable of serving as an interface between the various elements connected to circuit board 30. Circuit board 30 is coupled to base board 22 and electronically connects each of processor components 32 to control 34.

Control 34 serves as a traffic cop between each of the processor components 32 and memory 26. Although not shown, computing device 20 may additionally include a power supply for supplying power to each of the components, one or more cooling fans and a housing for enclosing and supporting each of the components. Overall, input/output 24, memory 26 and processor 28 cooperate with one another to provide information retrieval and processing.

Figure 2:
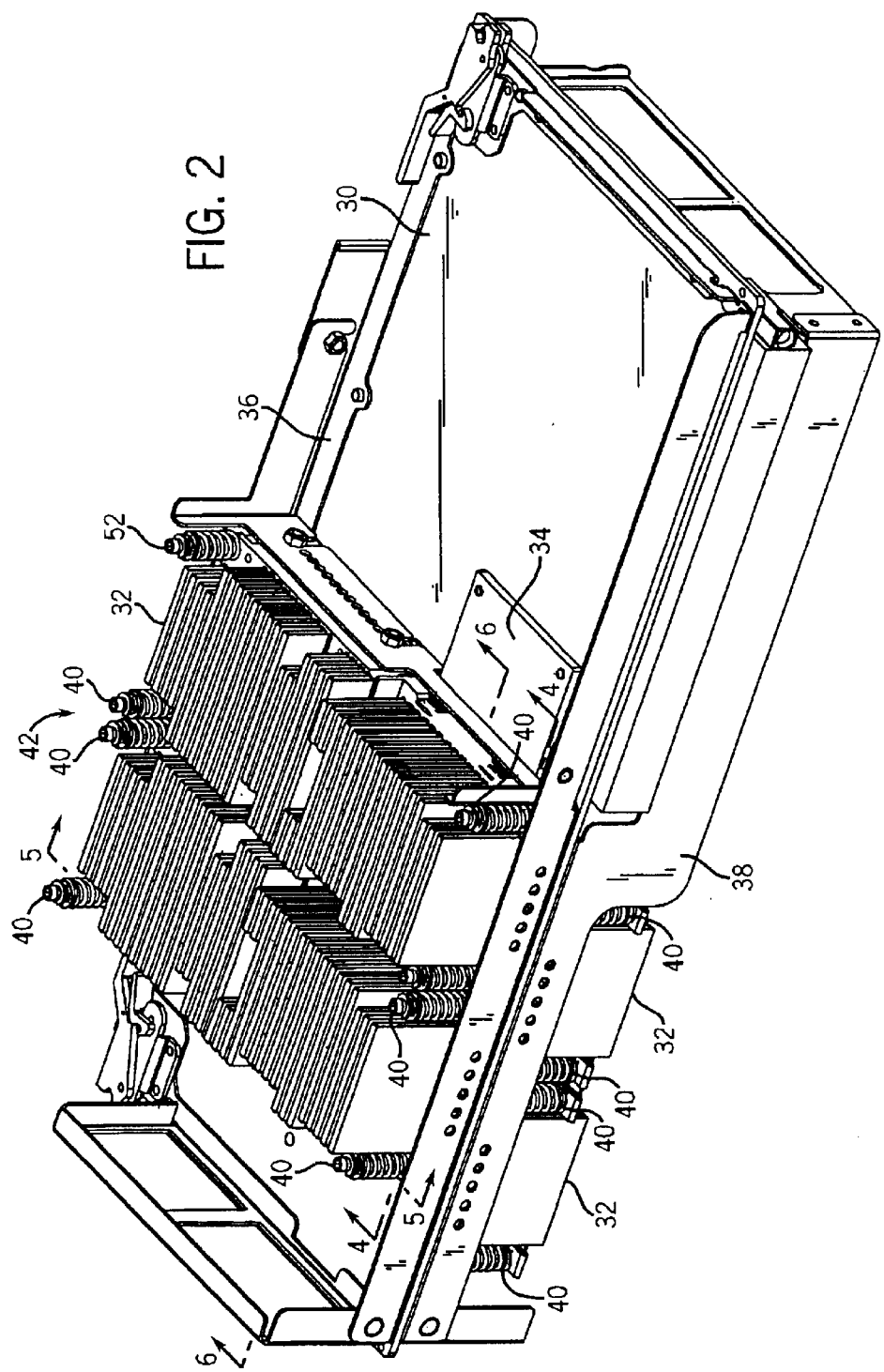
FIG. 2 is a top perspective view of the circuit board support assembly.
Figure 3:
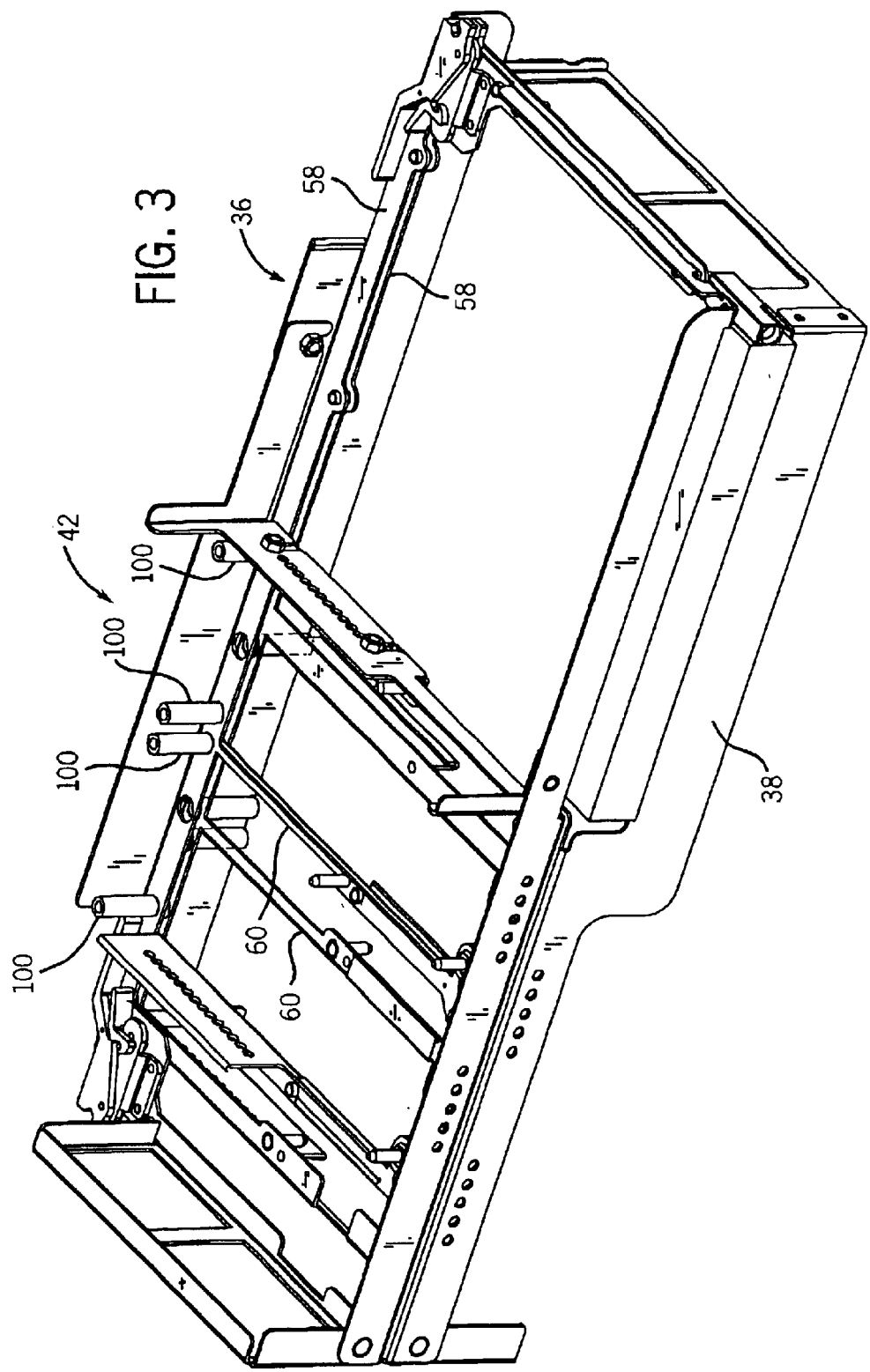
FIG. 3 is a top perspective view of the circuit board support assembly omitting a circuit board and electronic components of the circuit board support assembly for purposes of illustration.

As shown in FIGS. 2–6, processor 28 additionally includes at least one frame 36, 38 and attachment mechanisms 40. FIG. 2 is a perspective view of circuit board 30, components 32, frame 36, 38, and attachment mechanisms 40 which are collectively referred to as the circuit board support assembly 42. Frames 36 and 38 support and rigidify circuit board 30. Frames 36 and 38 extend on opposite sides of circuit board 30 in closely abutting contact with circuit board 30. FIG. 3 depicts circuit board support assembly 42 without circuit board 30 and components 32 to better illustrate frames 36 and 38. As best shown by FIG. 3, frames 36 and 38 each include perimeter portions 58 which extend about the perimeter of circuit board 30 and support spanning portions 60 that extend between opposite perimeter portions 58 across circuit board 30 to further rigidify the intermediate portions of circuit board 30. Frames 36 and 38 are generally formed by deformed sheet metal. As a result, frames 36 and 38 are lighter in weight and less expensive as compared to cast frames. Although less desirable, frames 36 and 38 may alternatively be formed from cast metal, machined metal or a molded polymer. Frames 36 and 38 may also have a variety of different configurations.

With reference to FIG. 2, processor components 32 are located on opposite sides of circuit board 30 in an electrical connection with circuit board 30. The processor components 32 illustrated constitute just one example of an electronic component that may be employed as part of circuit board support assembly 42 depending upon the computing device in which it is implemented. For purposes of disclosure, the term "electronic component" means any computing device element which communicates with or through circuit board 30. FIGS. 4 and 5 illustrate processor component 32 in greater detail. As shown by FIGS. 4 and 5, processor component 32 generally includes power supply 60, processor assembly 62 and heat sink 64. Power supply 60 generally delivers power to processor assembly 62. Power supply 60 is secured adjacent to an underside of heat sink 64 by a fastener 69.

Processor assembly 62 receives power from power supply 60 and processes information provided to it through circuit board 30. Heat sink 64 extends above and adjacent to both power supply 60 and processor assembly 62 and is configured to dissipate generated heat from power supply 60 and processor assembly 62. Heat sink 64 generally includes a platform 80 and cooling fins 81. Platform 80 supports cooling fins 81 and provides a structure for mounting the remainder of heat sink 64, power supply 60 and processor assembly 62 to one of frames 36, 38 using attachment mechanisms 40. In the particular embodiment illustrated, platform 80 includes a plurality of recessed flats 82 which bear against attachment mechanisms 40. Platform 80 additionally defines bores adjacent to flats 82 through which attachment mechanisms 40 are coupled to platform 80.

Overall, power supply 60 provides power to a processor assembly 62 which receives information via circuit board 30 and processes such information. At the same time, heat sink 64 dissipates heat generated by both power supply 60 and processor assembly 62. FIGS. 4 and 5 illustrate but one example of such a processor. Depending upon the computing device, component 32 may be provided with alternatively configured power supplies, alternatively configured processor assemblies, and alternatively configured heat sinks. Furthermore, in alternative applications, component 32 may omit power supply 60 and may include alternative component parts besides processor 72. Depending upon the amount of heat generated by such component parts, component 32 may or may not include heat sink 64.

Figure 7:
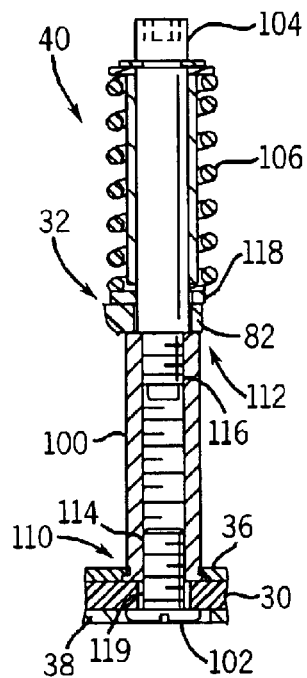
FIG. 7 is an enlarged fragmentary sectional view of an attachment structure of the circuit board support assembly shown in FIG. 2.

FIGS. 6 and 7 illustrate attachment mechanisms 40 in greater detail. Each attachment mechanism 40 couples both circuit board 30 and electronic component 32 to either frame 36 or frame 38 along a single common axis. As compared to circuit board support assemblies which attach components of the circuit board to frame along distinct axes, circuit board support assembly 42 requires less space across circuit board 30 with fewer attachment points along either frames 36 or 38. Consequently, circuit board 30 may support additional components and frame 36 and 38 may provide a greater degree of rigidity to circuit board 30. In addition, the assembly of circuit board support assembly 42 is simpler, less time consuming, and more cost effective.

FIG. 7 illustrates single attachment mechanism 40 extending above frame 36 joining circuit board 30 and component 32 to frame 36. The following description of the particular attachment mechanism 40 equally applies to those attachment mechanisms 40 extending below frame 38 and coupling circuit board 30 and component 32 to frame 38. The use of such terms as upward and downward, above and below, and the like, are merely chosen to describe the relationship between the elements as depicted in the figures and do not imply or require any particular orientation of circuit board support assembly 42 or its elements. For example, one element may extend upwardly, downwardly or sideways with respect to another element depending upon the orientation chosen for the circuit board support assembly 42.

As best shown by FIG. 7, each attachment mechanism 40 generally includes attachment structure 100, fastener 102, fastener 104, and spring 106. Attachment structure 100 generally comprises a rigid structure configured to extend away from frame 36 to support component 32 proximate to circuit board 30. Attachment structure 100 is further configured to cooperate with fasteners 102 and 104 to attach at least one of circuit board 30 and component 32 relative to frame 36.

In the particular embodiments shown in FIGS. 1–7, attachment structure 100 preferably comprises a standoff having frame end 110 nonrotatably attached to frame 36, a component end 112 bearing against flat 82 of heat sink 64, internal bore 114 receiving fastener 102, and internal bore 116 receiving fastener 104. In the embodiment shown, end 110 is pressed into frame 36 such that structure 100 cannot rotate relative to frame 36. In one embodiment, end 110 is noncircular in shape and is pressed into frame 36 such that frame 36 acts as a collar about structure 100. Bores 114 and 116 threadably engage fasteners 102 and 104, respectively. Because end 110 is nonrotatably coupled to frame 36, circuit board 30 and component 32 are secured to frame 36 without structure 100 rotating or spinning, facilitating easier assembly and disassembly of component 32 and reducing any risk of damage to circuit board support assembly 42 during assembly.

Although structure 100 is illustrated as being pressed into frame 36, structure 100 may alternatively be nonrotatably attached to frame 36 by other methods. For example, end 110 may alternatively have a non-circular shape which is received in a non-circular depression or aperture formed in frame 36, wherein end 110 mates with frame 36 to prevent rotation. Although structure 100 is illustrated as a standoff, structure 100 may alternatively comprise other structures extending between frame 36 and component 32. Because attachment structure 100 comprises a separate member distinct from both component 32 and frame 36, neither frame 36 nor component 32 require an upwardly or downwardly extending extension formed as part of either component 32 or frame 36. As a result, construction of both component 32 and frame 36 is simpler and less expensive.

Fastener 102 cooperates with structure 100 to couple circuit board 30 to frame 36. Fastener 102 extends through an aperture 119 in circuit board 30 into bore 114, capturing circuit board 30 between the head of fastener 102 and frame 36. Although fastener 102 is illustrated as a threaded bolt, fastener 102 may alternatively comprise other conventionally known or future developed fasteners configured to releasably or permanently attach to structure 100 so as to retain circuit board 30 against frame 36. For example, fastener 102 may alternatively comprise a screw configured to extend through circuit board 30 and into structure 100, wherein both or neither of circuit board 30 and structure 100 are provided with aligned apertures or bores for the receipt of the screw. Fastener 102 may also alternatively comprise a unidirectional one-way fastener. A unidirectional fastener is a fastener that is movable into engagement with another member in a single direction to prevent relative movement between the fastener and the member in the opposite direction. An example of one unidirectional fastener is toggler. Although fastener 102 is illustrated as extending into bore 114 and structure 100, structure 100 and fastener 102 may alternatively be configured such that structure 100 includes a portion projecting from end 110 such as a threaded stud, wherein fastener 102 includes a threaded bore which receives the threaded stud to couple fastener 102 and structure 100 together and to capture circuit board 30 therebetween.

Fastener 104 cooperates with structure 100 to couple component 32 to structure 100 and thereby couple component 32 to frame 36. Fastener 104 extends through component 32 into bore 116 of structure 100 while bearing against component 32. In the particular embodiment shown, fastener 104 bears against spring 106 to compress spring 106. Alternatively, fastener 104 may directly bear against component 32. Although fastener 104 is illustrated as an elongate threaded bolt extending through a washer 118 in threaded engagement with bore 116, fastener 104 may alternatively comprise other conventionally known or future developed fasteners to releasably or permanently couple component 82 to structure 100. For example, fastener 104 may alternatively comprise a screw to extend through component 82 and into structure 100. Fastener 104 may also alternatively comprise a unidirectional fastener such as a toggler.

Spring 106 extends between the head of fastener 104 and component 32. Spring 106 resiliently biases component 82 towards frame 36 and circuit board 30. Spring 106 regulates the amount of force by which those portions of component 82 which are electrically connected to circuit board 30 are pressed against circuit board 30. Although less desirable, spring 106 may be omitted and fastener 104 may be reconfigured such that fastener 104 directly bears against component 82 to couple component 82 to structure 100 and frame 36.

FIG. 6 illustrates the use of attachment mechanisms 40 in greater detail. As shown by FIG. 6, attachment mechanisms 40 extend in opposite directions relative to circuit board 30 and join circuit board 30 to both frames 36 and 38, as well as to electronic components 32 located on opposite sides of circuit board 30. In particular, each attachment mechanism 40 couples component 32 and circuit board 30 to an intermediate frame 36 or an intermediate frame 38 along a single axis 120. Coupling circuit board 30 and components 32 to frame 36, 38 along a single axis 120 conserves space adjacent circuit board 30 which would otherwise be required to carry component fastening structures. Coupling all three elements along a single axis 120 further reduces the number of connection points required along frame 38, increasing the structural rigidity provided by frames 36 and 38 to circuit board 30. Moreover, the assembly of board support assembly 40 is simpler and less time consuming.

In addition, attachment structures 100 cooperate with flats 82 of heat sink 64 to provide a hard stop to minimize the transmission of loads to component 32. Because attachment structures 100 bear against flat 82 located at each of the four corners of heat sink 64, undesirable rocking of heat sink 64 and component 32 is minimized as the component 32 is being seated. Moreover, attachment structure 100 enables the construction of heat sink 64 to be simplified by eliminating the need to add material to the face of heat sink 64 to provide a hard stop to minimize loads transmitted to component 32.

Because structure 100 is pressed into frame 36, structure 100 is attached to frame 36 without additional fasteners. As a result, fasteners 102 may be omitted from selected attachment mechanisms 40 in circumstances where circuit board 30 is sufficiently secured to frame 36 by other attachment mechanisms 40 including fasteners 102. Although fasteners 102 are illustrated as having heads substantially recessed in counter sinks 103 to conserve space adjacent to the opposite frame having the counter sink 103, fasteners 102 may alternatively have heads which bear against the opposite frame 36, 38 to further secure the opposite frame 36, 38 to board 30. Although attachment mechanisms 40 are illustrated as part of assembly 40 which includes frames and components on both sides of circuit board 30, assembly 40 may alternatively have a frame and components on only a single side of circuit board 30.

Overall, the circuit board support assembly 42 shown in FIGS. 2–6 incorporates two beneficial features which optimize the functioning of assembly 40. These features include: (1) the coupling of component 32 and circuit board 30 to frame 36 or frame 38 along a single common axis and (2) the use of an attachment structure that is non-rotatably attached to the frame, preventing the attachment structure from undesirably spinning or rotating during attachment of the component 32. Although less desirable, each of these features may be independently employed on a circuit board support assembly. For example, as will be described hereafter with respect to FIGS. 8–11, components 32 and circuit board 30 may alternatively be coupled to one or both of frames 36 and 38 along a single common axis using attachment structures that are rotatably coupled to adjacent frame 36, 38. Likewise, although the attachment structure 100 shown in FIG. 7 is illustrated as coupling component 32 and circuit board 30 to frame 36 along a single common axis, attachment structure 100 may alternatively be employed to couple only component 32 to frame 36, wherein circuit board 30 would be coupled to frame 36 by other attachment mechanisms or methods. Methods of this application are shown in FIG. 6 in which certain attachment mechanisms 40 omit fastener 102. As shown by alternative attachment structure 150 in FIG. 6, end 110 may not need to be configured to attach to fastener 102 such that bore 114 may be omitted.

Figure 8:
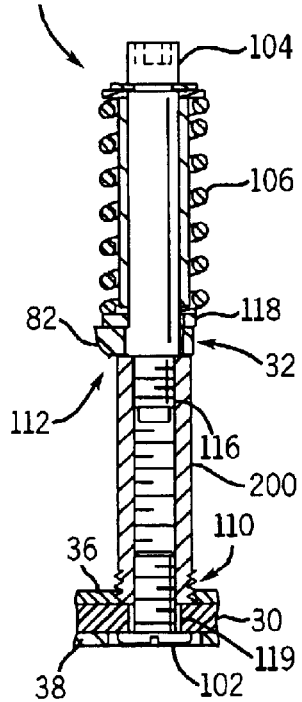
FIG. 8 is an enlarged fragmentary sectional view of a first alternative embodiment of the attachment structure of FIG. 7.

FIGS. 8–11 illustrate the alternative embodiments of attachment structure 100 configured to couple component 32 and circuit board 30 to frame 36 and frame 38. FIG. 8 illustrates attachment structure 200, an alternative embodiment of attachment structure 100. Attachment structure 200 is substantially similar to attachment structure 100 except that attachment structure 200 has an end portion 110 threaded or screwed into frame 36, rather than being pressed into frame 36. Although end 110 of structure 200 is illustrated as being screwed directly into frame 36, end 110 may alternatively be screwed into a threaded insert which is itself screwed into frame 36 such as when frame 36 is a cast frame as otherwise formed from a softer material necessitating the use of insert of a harder material. Like attachment structure 100, attachment structure 200 is part of an attachment mechanism 240 which couples component 82 and circuit board 30 to frame 36 along a single axis conserving space and reducing assembly complexity.

Figure 9:
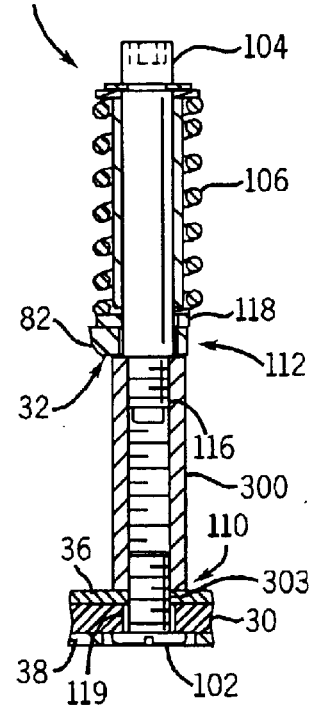
FIG. 9 is an enlarged fragmentary sectional view of a second alternative embodiment of the attachment structure shown in FIG. 7.

FIG. 9 illustrates attachment structure 300 as part of an attachment mechanism 340. Attachment structure 300 is substantially similar to attachment structure 100 except that end 110 of attachment structure 300 bears against an upper surface of frame 36. In this alternative application, aperture 303 through which fastener 102 extends is preferably dimensioned in close tolerance with fastener 102 to prevent or substantially minimize any relevant movement of frame 36 and structure 300. Like attachment structure 100, structure 300 couples component 82 and circuit board 30 to frame 36 along a single common axis.

Figure 10:
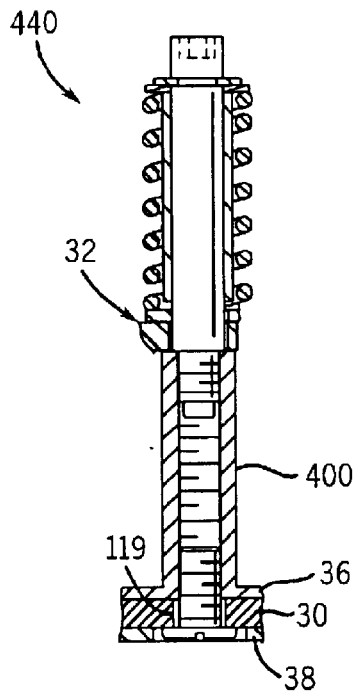
FIG. 10 is an enlarged fragmentary sectional view of a third alternative embodiment of the attachment structure shown in FIG. 7.

FIG. 10 illustrates attachment structure 400, an alternative embodiment of attachment structure 100, as shown in FIG. 7. Attachment structure 400, as part of attachment mechanism 440, is similar to attachment structure 100 except that end 110 of attachment structure 400 is integrally formed as a single unitary body with frame 36. As such, attachment structure 400 is rotatably coupled to frame 36 and nonrotatably attached to frame. Like attachment structure 100, attachment structure 400 couples component 32 to circuit board 30 to frame 36 along a single axis.

Figure 11:
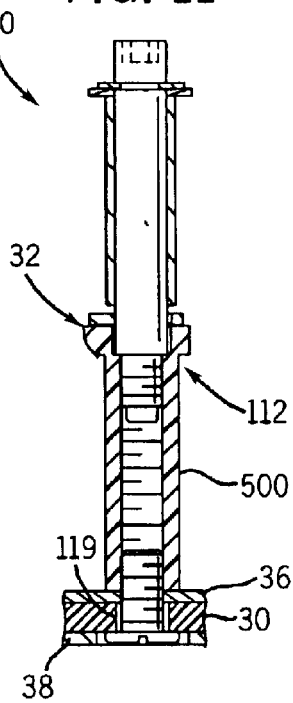
FIG. 11 is an enlarged fragmentary sectional view of a fourth alternative embodiment of the attachment structure shown in FIG. 7.

FIG. 11 illustrates attachment structure 500, an alternative embodiment of attachment structure 100. Attachment structure 500, as part of attachment mechanism 540, is similar to attachment structure 100 except that end 112 of attachment structure 500 is generally formed as a single unitary body with component 32. As such, spring 106 is no longer necessary. Attachment structure 100, attachment structure 500 couples component 32 and circuit board 30 to frame 36 along a single axis.

Although the present invention has been described with reference to preferred embodiments, workers skilled in the art will recognize that changes may be made in form and detail without departing from the spirit and scope of the invention. For example, although different preferred embodiments may have been described as including one or more features providing one or more benefits, it is contemplated that the described features may be interchanged with one another or alternatively be combined with one another in the described preferred embodiments or in other alternative embodiments. Because the technology of the present invention is relatively complex, not all changes in the technology are foreseeable. The present invention described with reference to the preferred embodiments and set forth in the following claims is manifestly intended to be as broad as possible. For example, unless specifically otherwise noted, the claims reciting a single particular element also encompass a plurality of such particular elements.

What is claimed is:

1. A circuit board support assembly comprising:
   a circuit board having a perimeter, a first side and a second side;
   a first frame extending along the perimeter of the circuit board on the first side of the circuit board so as to expose a majority of the first side of the circuit board; and
   a first electronic component, wherein the circuit board and the first electronic component are coupled to the first frame along a first common axis passing through the first frame;
   a first attachment structure provided on the first frame and extending between the first frame and the first electronic component along the first common axis such that the first electronic component is spaced from the first frame by the first attachment structure along the first axis, wherein the circuit board and the first electronic component are each coupled to the first attachment structure;
   a second attachment structure extending between the first frame and the first electronic component; and
   a third attachment structure extending between the first frame and the first electronic component, wherein the circuit board and the first electronic component are each coupled to the second attachment structure and the third attachment structure.

2. The assembly of claim 1, wherein the first attachment structure is permanently coupled to at least one of the first frame and the first electronic component.

3. The assembly of claim 2, wherein the first attachment structure is permanently attached to one of the first frame and the first electronic component.

4. The assembly of claim 3, wherein the first attachment structure is permanently attached to the frame.

5. The assembly of claim 4, wherein the first attachment structure is pressed into the frame.

6. The assembly of claim 2, wherein the first attachment structure is integrally formed as a single unitary body with one of the first frame and the electronic component.

7. The assembly of claim 1, wherein the first attachment structure is nonrotatably attached to the first frame.

8. The assembly of claim 7, the first attachment structure is pressed into the first frame.

9. The assembly of claim 1, wherein the first attachment structure is screwed into the frame.

10. The assembly of claim 1, wherein the first attachment structure is removably positioned between the first frame and the first electronic component.

11. The assembly of claim 1, wherein the first electronic component is removably attached to the first attachment structure.

12. The assembly of claim 11, wherein the circuit board is removably attached to the first attachment structure.

13. The assembly of claim 12 including:
   a first fastener removably attaching the first electronic component to the first attachment structure; and
   a second fastener removably attaching the circuit board to the first attachment structure.

14. The assembly of claim 13, wherein the first attachment structure includes a first internal bore receiving the first fastener and a second internal bore receiving the second fastener.

15. The assembly of claim 1, wherein the first attachment structure comprises a standoff.

16. The assembly of claim 1, wherein the first frame extends between the circuit board and the first electronic component.

17. The assembly of claim 1 including:
   a second frame, wherein the circuit board extends between the first frame and the second frame; and
   a second electronic component, wherein the circuit board and the second electronic component are joined to a second frame along a second common axis.

18. The assembly of claim 17, wherein the first electronic component is on a first side of the circuit board and wherein the second electronic component is on a second opposite side of the circuit board.

19. The assembly of claim 1 including a first fastener extending through the circuit board and the first frame along the first axis to couple the circuit board to the first frame.

20. The assembly of claim 19 including an attachment structure, wherein the first fastener engages the attachment structure.

21. The assembly of claim 20 including a second fastener extending through the first electronic component into engagement with the attachment structure along the first axis.

22. A computing device comprising:
a base board;
a memory coupled to the base board;
input/output coupled to the base board; and
a processor coupled to the base board, the processor including:
a motherboard;
a central electronic control coupled to the motherboard; and
a plurality of processor units coupled to the motherboard, each processor unit including:
a circuit board having a perimeter, a first side and a second side;
a first frame extending along the perimeter of the circuit board on the first side of the circuit board so as to expose a majority of the first side of the circuit board;
a first electronic component, wherein the circuit board and the first electronic component are coupled to the first frame along a common axis.

23. A method for assembling a circuit board support assembly, the method, comprising:
coupling a circuit board, a first frame extending along a perimeter of the circuit board on a side of the circuit board so as to expose a majority of the side of the circuit board, and a first electronic component having a heat sink with a plurality of cooling fins to one another along a first common axis;
positioning a standoff between the first frame and the first electronic component abutting the first electronic component; and
electrically connecting the first electronic component to the circuit board.

24. The original method of claim 23, wherein the standoff has an end portion adjacent to the frame and projects beyond the frame without passing through the circuit board.

25. The method of claim 23 coupling a second frame to the circuit board opposite the first frame along a second axis.

26. The method of claim 25 including coupling a second electronic component to the second frame along the second axis.

27. The assembly of claim 1, wherein the first frame extends between the circuit board and the first electronic component and wherein the first attachment structure extends through the first frame.

28. The assembly of claim 27, wherein the first attachment structure is pressed into the frame such that the frame forms a collar about the first attachment structure.

29. The assembly of claim 1, wherein the first frame extends between the circuit board and the first electronic component and wherein the frame comprises sheet metal.

30. The assembly of claim 1 including:
a first fastener removably attaching the first electronic component to the first attachment structure; and
a second fastener removably attaching the circuit board to the first attachment structure, wherein the first fastener and the second fastener extend along the common axis.

31. The assembly of claim 30, wherein the first fastener retains the first electronic component against movement along the common axis.

32. The assembly of claim 1 including a fourth attachment structure extending between the first frame and the first electronic component, wherein the circuit board and the first electronic component are each coupled to the fourth attachment structure.

33. The assembly of claim 32, wherein the first attachment structure, the second attachment structure, the third attachment structure and the fourth attachment structure are each pressed into the first frame such that the first frame forms a collar about the first attachment structure the second attachment structure, the third attachment structure and the fourth attachment structure.

34. The assembly of claim 32 including:
a second electronic component; and
a fifth attachment structure extending between the first frame and the second electronic component, wherein the circuit board and the second electronic component are each coupled to the fifth attachment structure.

35. The assembly of claim 34 including:
a sixth attachment structure extending between the first frame and the second electronic component; and
a seventh attachment structure extending between the first frame and the second electronic component, wherein the circuit board and the second electronic component are each coupled to the sixth attachment structure and the seventh attachment structure.

36. The assembly of claim 35, wherein the first attachment structure, the second attachment structure, the third attachment structure, the fourth attachment structure, the fifth attachment structure, the sixth attachment structure and the seventh attachment structure are substantially identical to one another.

37. The assembly of claim 36, wherein the first attachment structure, the second attachment structure, the third attachment structure, the fourth attachment structure, the fifth attachment structure, the sixth attachment structure and the seventh attachment structure each comprise a single member.

38. The assembly of claim 1, wherein the first frame extends substantially about an entirety of the perimeter of the circuit board.

39. The assembly of claim 1, wherein the first attachment structure comprises a single member.

40. The assembly of claim 1, wherein the first frame forms an opening adjacent the circuit board.

41. The assembly of claim 40, wherein the first electronic component extends through the opening and is electrically connected to the circuit board.

42. The assembly of claim 1, wherein the first electronic component includes a heat sink and wherein the first attachment structure abuts the heat sink.

43. The assembly of claim 42, wherein the heat sink includes a flat against which the first attachment structure abuts.

44. The device of claim 22 including:
a first attachment structure extending between the first frame and the first electronic component, wherein the circuit board and the first electronic component are each coupled to the first attachment structure along a first common axis;
a second attachment structure extending between the first frame and the first electronic component, wherein the circuit board and the first electronic component are each coupled to the second attachment structure along a second common axis; and
a third attachment structure extending between the first frame and the first electronic component, wherein the circuit board and the first electronic component are each coupled to the third attachment structure along a third common axis.

45. The device of claim 44 including:
a fourth attachment structure extending between the first frame and the first electronic component, wherein the circuit board and the first electronic component are each coupled to the fourth attachment structure along a fourth common axis.

46. The device of claim 44 including:
a second electronic component; and
a fifth attachment structure extending between the first frame and the second electronic component, wherein the circuit board and the second electronic component are each coupled to the fifth attachment structure along a fifth common axis.

47. The device of claim 44, wherein the first electronic component includes a heat sink.

48. The device of claim 47, wherein the heat sink includes a plurality of flats against which the first attachment structure, the second attachment Structure and the third attachment structure abut.

49. The device of claim 44, wherein the first frame extends between the circuit board and the first electronic component.

50. The device of claim 44 including:
a first fastener removably attaching the first electronic component to first attachment structure; and
a second fastener removably attaching the circuit board to the first attachment structure, wherein the first fastener and the second fastener extend along the first common axis.

51. The device of claim 44, wherein the first frame extends between the circuit board and the first electronic component and wherein the first attachment structure extends through the frame.

52. The device of claim 51, wherein the first attachment structure is pressed into the first frame such that the first frame forms a collar about the first attachment structure.

53. The device of claim 44 wherein the first frame is formed from sheet metal.

54. The device of claim 44 including:
a second frame;
a second electronic component, wherein the first electronic component is on a first side of the circuit board and wherein the second electronic component is on a second opposite side of the circuit board;
a fourth attachment structure extending between the second frame and the second electronic component, wherein the circuit board and the second electronic component are each coupled to the fourth attachment structure along a fourth common axis; and
a fifth attachment structure extending between the second frame and the second electronic component, wherein the circuit board and the second electronic component are each coupled to the fifth attachment structure along a fifth common axis.

55. The device of claim 54, wherein the fourth common axis and the fifth common axis are distinct from the first common axis, the second common axis and the third common axis.

56. The device of claim 54, wherein the first attachment structure has a first end portion adjacent the first frame and extends from the first frame to the first electronic component.

57. The device of claim 56, wherein the fifth attachment structure has a second end portion adjacent the second frame and extends from the second frame to the second electronic component and wherein the first attachment structure and the fifth attachment structure extend from the first frame and the second frame, respectively, in opposite directions.

58. A circuit board support assembly comprising:
a circuit board;
an electronic component;
a frame;
a first attachment structure pressed into the frame such that the frame forms a collar projecting into an annular groove extending about the first attachment structure, wherein the first attachment structure extends between the frame and the electronic component and wherein the circuit board and the electronic component are coupled to the first attachment structure along a first common axis;
a second attachment structure pressed into the frame such that the frame forms a collar projecting into an annular groove extending about the second attachment structure, wherein the second attachment structure extends between the frame and the electronic component and wherein the circuit board and the electronic component are coupled to the second attachment structure along a second common axis; and
a third attachment structure pressed into the frame such that the frame forms a collar projecting into an annular groove extending about the third attachment structure, wherein the third attachment structure extends between the frame and the electronic component and wherein the circuit board and the electronic component are coupled to the third attachment structure along a third common axis.

59. A circuit board support assembly comprising:
a circuit board;
an electronic component;
a frame;
a first attachment structure extending between the frame and the electronic component;
a first fastener removably attaching the electronic component to the first attachment structure;
a second fastener removably attaching the circuit board to the first attachment structure, wherein the first fastener and the second fastener extend along a first common axis non-parallel to the circuit board and the frame and passing through the frame;
a second attachment structure extending between the frame and the electronic component;
a third fastener removably attaching the electronic component to the second attachment structure;
a fourth fastener removably attaching the circuit board to the second attachment structure, wherein the third fastener and the fourth fastener extend along a second common axis non-parallel to the circuit board and the frame and passing through the frame;
a third attachment structure extending between the frame and the electronic component;
a fifth fastener removably attaching the electronic component to the third attachment structure; and
a sixth fastener removably attaching the circuit board to the third attachment structure, wherein the fifth fastener and the sixth fastener extend along a third common axis non-parallel to the circuit board and the frame and passing through the frame.

60. The assembly of claim 59, wherein each of the first fastener, the second fastener, the third fastener, the fourth fastener, the fifth fastener and the sixth fastener is a single member.

61. A circuit board support assembly comprising:
a circuit board having a perimeter;
an electronic component having a heat sink with a plurality of cooling fins;
a frame extending substantially about an entirety of the perimeter and forming an opening adjacent the circuit board;

a first attachment structure extending between the frame and the electronic component, wherein the circuit board and the electronic component are each coupled to the first attachment structure along a first common axis;

a second attachment structure extending between the frame and the electronic component, wherein the circuit board and the electronic component are each coupled to the second attachment structure along a second common axis; and a third attachment structure extending between the frame and the electronic component, wherein the circuit board and the electronic component are each coupled to the third attachment structure along a third common axis.

62. The assembly of claim 61, wherein the electronic component extends through the opening and is electrically connected to the circuit board.

63. A circuit board support assembly comprising:

a circuit board;

a first frame;

a first electronic component, wherein the circuit board and the first electronic component are coupled to the first frame along a first common axis passing through the first frame;

a second frame, wherein the circuit board extends between the first frame and the second frame and wherein the first frame extends between the first electronic component and the circuit board;

a second electronic component, wherein the second frame extends between the second electronic component and the circuit board, wherein the circuit board and the second electronic component are coupled to the second frame along a second common axis, wherein the first electronic component is on a first side of the circuit board and wherein the second electronic component is on a second opposite side of the circuit board;

a first attachment structure extending between the first frame and the first electronic component, wherein the circuit board and the first electronic component are each coupled to the first attachment structure along the first common axis;

a second attachment structure extending between the first frame and the first electronic component, wherein the circuit board and the first electronic component are each coupled to the second attachment structure along a second common axis passing through the first frame; and a third attachment structure extending between the first frame and the first electronic component, wherein the circuit board and the first electronic component are each coupled to the third attachment structure along a third common axis passing through the first frame, wherein each of the first attachment structure, the second attachment structure and the third attachment structure has a first end portion in contact with and terminating at the first frame, so as to extend from the first frame to the first electronic component; and a fourth attachment structure extending between the second frame and the second electronic component, wherein the circuit board and the second electronic component are coupled to the fourth attachment structure along a fourth common axis passing through the second frame;

a fifth attachment structure extending between the second frame and the second electronic component, wherein the circuit board and the second electronic component are coupled to the fifth attachment structure along a fifth common axis passing through the second frame; and a sixth attachment structure extending between the second frame and the second electronic component, wherein the circuit board and the second electronic component are coupled to the sixth attachment structure along a sixth common axis passing through the second frame, wherein each of the fourth attachment structure, the fifth structure and the sixth attachment structure have an end portion in contact with and terminating at the second frame so as to extend from the second frame to the second electronic component.

64. The assembly of claim 63, wherein the first attachment structure is permanently coupled to at least on of the first frame and the first electronic component.

65. The assembly of claim 64, wherein the first attachment structure is permanently attached to one of the first frame and the first electronic component.

66. The assembly of claim 65, wherein the first attachment structure is permanently attached to the first frame.

67. The assembly of claim 66, wherein the first attachment structure is pressed into the first frame.

68. The assembly of claim 63, wherein the first attachment structure is nonrotatably attached to the first frame.

69. The assembly of claim 68, wherein the first attachment structure is pressed into the first frame such that the first frame forms a collar about the first attachment structure.

70. The assembly of claim 63 wherein the first electronic component is removably attached to the first attachment structure.

71. The assembly of claim 70, wherein the circuit board is removably attached to the first attachment structure.

72. The assembly of claim 63 including:

a first fastener removably attaching the first electronic component to the first attachment structure; and a second fastener removably attaching the circuit board to the first attachment structure.

73. The assembly of claim 72, wherein the first attachment structure includes a first internal bore receiving the first fastener and a second internal bore receiving the second fastener.

74. The assembly of claim 63, wherein the first attachment structure comprises a standoff.

75. The assembly of claim 63, wherein both the first frame and the second frame extend between the first electronic component and the second electronic component.

76. The assembly of claim 63, wherein the first frame is in abutting contact with the circuit board.

77. The assembly of claim 1, wherein the first electronic component includes a heat sink having a plurality of cooling fins.

78. The assembly of claim 1 including:

a second frame extending along the perimeter of the circuit board on the second side of the circuit board so as to expose a majority of the second side of the circuit board;

a second electronic component on an opposite side of the circuit board as the first electronic component, wherein the circuit board and the second electronic component are coupled to the second frame along a second common axis passing through the second frame;

a first attachment structure extending between the first frame and the first electronic component along the first common axis, wherein the first common axis passes through the first frame, wherein the first frame is between the circuit board and the first electronic component, wherein the circuit board and the first electronic component are each coupled to the first attachment structure, wherein the first attachment structure has a first end portion adjacent the first frame and wherein the first attachment structure extends from the first frame towards the first electronic component; and a second attachment structure extending between the second frame and the second electronic component along the second common axis, wherein the second frame is between the circuit board and the second electronic component, wherein the circuit board and the second electronic component are each coupled to the second attachment structure, wherein the second attachment structure has an end portion adjacent the second frame and wherein the second attachment structure extends from the second frame towards the second electronic component.

79. The assembly of claim 78, wherein the first end portion and the second end portion comprise heads of the first attachment structure and the second attachment structure, respectively.

80. A circuit board support assembly comprising:

a circuit board having a perimeter, a first side and a second side;

a first frame extending along the perimeter of the circuit board on the first side of the circuit board so as to expose a majority of the first side of the circuit board; and a first electronic component having a heat sink with a plurality of cooling fins;

a circuit board; and a standoff between the first frame and the first electronic component, wherein the standoff has an end portion adjacent the frame and projects beyond the frame without passing through the circuit board and wherein the circuit board and the first electronic component are coupled to the first frame along a common axis.

81. A circuit board support assembly comprising:

a circuit board;

a first frame;

a first electronic component, wherein the circuit board and the first electronic component are coupled to the first frame along a first common axis passing through the first frame;

a second frame, wherein the circuit board extends between the first frame and the second frame and wherein the first frame extends between the first electronic component and the circuit board;

a second electronic component, wherein the circuit board and the first electronic component are coupled to the second frame along a second common axis passing through the second frame and wherein the second frame extends between the second electronic component and the circuit board;

a first attachment structure provided on the first frame and extending between the first frame and the first electronic component, wherein the circuit board and the first electronic component are each coupled to the first attachment structure along the first common axis, wherein the first attachment structure has a first end portion adjacent the first frame and wherein the first attachment structure extends from the first frame towards the first electronic component; and a second attachment structure extending between the second frame and the second electronic component, wherein the circuit board and the second electronic component are each coupled to the second attachment structure along the second common axis, wherein the second attachment structure has a second end portion adjacent the second frame and wherein the second attachment structure extends from the second frame towards the second electronic component, wherein the first attachment structure spaces the first electronic component from the first frame along the first common axis and wherein the second attachment structure spaces the second electronic component from the second frame along the second common axis.

82. The assembly of claim 81 wherein the first electronic component includes a first heat sink having a plurality of cooling fins and wherein the second electronic component includes a second heat sink having a second plurality of cooling fins.

* * * * *